United States Patent
Hikino

(10) Patent No.: US 9,848,505 B2
(45) Date of Patent: Dec. 19, 2017

(54) CASE AND WIRELESS COMMUNICATION DEVICE

(71) Applicant: SHARP KABUSHIKI KAISHA, Osaka-shi, Osaka (JP)

(72) Inventor: Nozomu Hikino, Osaka (JP)

(73) Assignee: Sharp Kabushiki Kaisha, Osaka (JP)

(*) Notice: Subject to any disclaimer, the term of this patent is extended or adjusted under 35 U.S.C. 154(b) by 0 days.

(21) Appl. No.: 14/434,798

(22) PCT Filed: Nov. 25, 2013

(86) PCT No.: PCT/JP2013/081634
§ 371 (c)(1),
(2) Date: Apr. 10, 2015

(87) PCT Pub. No.: WO2014/122838
PCT Pub. Date: Aug. 14, 2014

(65) Prior Publication Data
US 2015/0289401 A1    Oct. 8, 2015

(30) Foreign Application Priority Data
Feb. 8, 2013  (JP) ................ 2013-023715

(51) Int. Cl.
*H05K 5/00* (2006.01)
*H05K 5/02* (2006.01)
(Continued)

(52) U.S. Cl.
CPC .......... *H05K 5/0247* (2013.01); *H01Q 1/242* (2013.01); *H01Q 1/38* (2013.01); *H05K 5/069* (2013.01)

(58) Field of Classification Search
CPC ............................. H05K 5/0247; H05K 5/069
(Continued)

(56) References Cited

U.S. PATENT DOCUMENTS 5,731,629 A * 3/1998 Woodward ....... G06K 19/07743
174/528
8,053,668 B2 * 11/2011 Lai ...................... H05K 9/0009
174/17 R
(Continued)

FOREIGN PATENT DOCUMENTS

JP    2003-318501 A    11/2003
JP    2007-288360 A    11/2007
(Continued)

OTHER PUBLICATIONS

LPKF "Designing three-dimensional circuitry bodies (MIDs)", http://www.lpkfusa.com/mid/lasersystems.htm.

*Primary Examiner* — Hung V Ngo
(74) *Attorney, Agent, or Firm* — Birch, Stewart, Kolasch & Birch, LLP

(57) ABSTRACT

A housing for storing therein a circuit board, includes: a through hole; an electrically conductive pattern passing through inner walls of the through hole so as to be stretched from the outside surface of the housing to the inside surface of the housing, and being electrically connected to the circuit board; and a plug member with which the through hole is filled, the through hole having openings on the outside and the inside, respectively, of the housing, and the opening on the outside of the housing being larger than the opening on the inside of the housing.

9 Claims, 2 Drawing Sheets

(51) Int. Cl.
*H01Q 1/24* (2006.01)
*H01Q 1/38* (2006.01)
*H05K 5/06* (2006.01)

(58) Field of Classification Search
USPC .............................. 174/564; 455/90.3, 575.7
See application file for complete search history.

(56) References Cited

U.S. PATENT DOCUMENTS

| | | | |
|---|---|---|---|
| 8,165,645 B2* | 4/2012 | Lee | H01Q 1/243 455/575.1 |
| 8,264,837 B2* | 9/2012 | Pakula | G06F 1/1626 220/4.02 |
| 2005/0157480 A1* | 7/2005 | Sun | H05K 5/067 361/797 |
| 2006/0032653 A1* | 2/2006 | Minoshima | H01R 13/5216 174/564 |
| 2006/0170597 A1* | 8/2006 | Kurashima | H01Q 1/22 343/700 MS |
| 2007/0241971 A1 | 10/2007 | Tsujimura et al. | |
| 2008/0182539 A1* | 7/2008 | Hata | H01Q 1/22 455/269 |
| 2009/0057006 A1* | 3/2009 | Kishibata | H05K 5/0047 174/521 |
| 2016/0033273 A1* | 2/2016 | Kamisuki | G01C 19/5705 73/504.12 |

FOREIGN PATENT DOCUMENTS

| | | |
|---|---|---|
| JP | 2008-187741 A | 8/2008 |
| JP | 2009-27019 A | 2/2009 |
| JP | 2009-060268 A | 3/2009 |
| WO | WO 2012/086034 A1 | 6/2012 |

* cited by examiner

CASE AND WIRELESS COMMUNICATION DEVICE

TECHNICAL FIELD

The present invention relates to a housing for storing therein a circuit board, and to a wireless communication device.

BACKGROUND ART

There has been developed a technique for providing a housing having a through hole with an electrically conductive pattern that passes through the through hole. For example, Non Patent Literature 1 discloses a technique for providing a tapered through hole with an electrically conductive pattern by use of an LDS (Laser Direct Structuring) method in which light (laser) irradiation is used.

There has recently been developed a portable wireless terminal in which an electrically conductive pattern formed as described earlier is used as an antenna. According to the portable wireless terminal, a through hole through which an electrically conductive pattern passes is tapered and opens toward an inside of a housing so as to be inconspicuous when externally seen.

CITATION LIST

Non Patent Literature

Non Patent Literature 1
LPKF, "Designing three-dimensional circuitry bodies (MIDs)" acquired on Jun. 7, 2012 from http://www.lpkfusa.com/mid/lasersystems.htm

SUMMARY OF INVENTION

Technical Problem

However, according to such a conventional technique as described earlier, presence of a through hole through which an electrically conductive pattern passes makes it impossible to obtain a waterproof and dustproof function. In order to obtain the waterproof and dustproof function, inventors of the present invention studied a structure in which a through hole of a conventional technique is filled with a grouting material. However, the inventors found that the through hole merely filled with the grouting material causes a problem.

That is, as illustrated in (a) of FIG. 4 and (b) of FIG. 4, which is an enlarged view of (a) of FIG. 4, there occurs the following problem: In a housing 103 having a through hole 101 that is tapered and opens toward an inside (B side in (a) and (b) of FIG. 4) of the housing 103 so as to be inconspicuous when externally seen, in a case where the through hole 101 is filled with a grouting material 102, the housing 103 cannot support the grouting material 102 which is pressed externally (from the A side in (a) and (b) of FIG. 4), so that the grouting material 102 may fall off toward the inside (B side in (a) and (b) of FIG. 4) of the housing 103. Same applies to a case where the housing 103 has a cylindrical through hole 111 as illustrated in (c) of FIG. 4. In a case where the grouting material 102 falls off toward the inside (B side in (c) of FIG. 4) of the housing 103, waterproof and dustproof performance deteriorates and the grouting material 102 moves inside the housing 103, so that a component such as a circuit board 104 may be damaged or broken. This requires a technique for suitably filling the through hole of the housing 103.

The present invention has been made in view of the problem, and a main object of the present invention is to provide a technique for suitably filling a through hole with which a housing is provided and through which an electrically conductive pattern passes.

Solution to Problem

In order to attain the object, a housing in accordance with an aspect of the present invention is a housing for storing therein a circuit board, includes: a through hole opening into a space between an outside and an inside of the housing; an electrically conductive pattern passing through inner walls of the through hole so as to be stretched from the outside surface of the housing to the inside surface of the housing, and being electrically connected to the circuit board; and a plug member with which the through hole is filled, the through hole having openings on the outside and the inside, respectively, of the housing, and the opening on the outside of the housing being larger than the opening on the inside of the housing.

Advantageous Effects of Invention

According to the aspect of this invention, since the opening of the through hole on the outside of the housing is larger than the opening of the through hole on the inside of the housing, the through hole has a shape for supporting the plug member from the inside of the housing. This can prevent the plug member which is pressed from the outside of the housing from falling off, so that the through hole can be suitably filled with the plug member.

BRIEF DESCRIPTION OF DRAWINGS (a) of FIG. 1 illustrates a portable terminal in accordance with Embodiment 1 of the present invention. (b) of FIG. 1 is an enlarged view of a through hole of (a) of FIG. 1 and a vicinity of the through hole.

Figure 4:
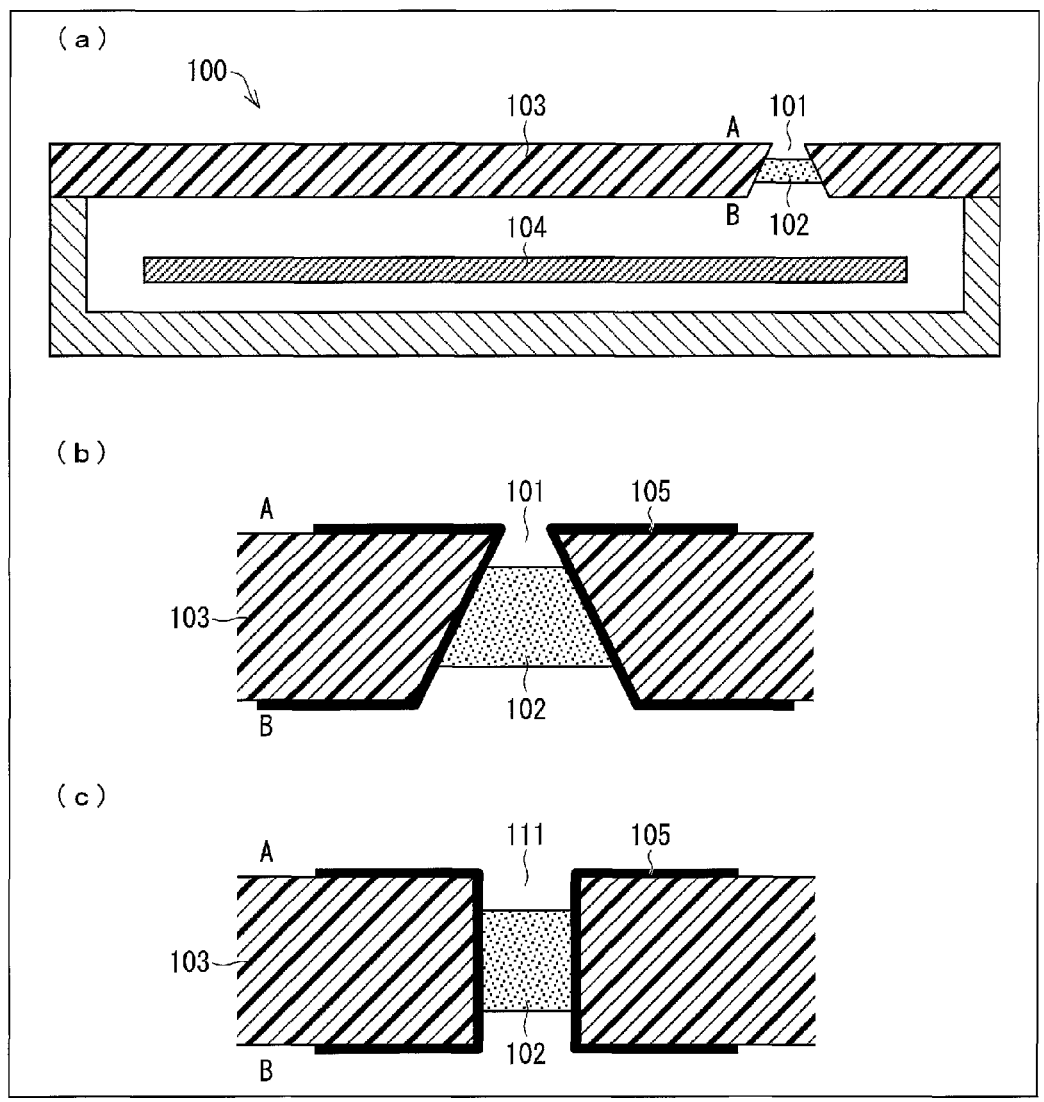

(a) of FIG. 4 illustrates a portable terminal in accordance with a reference example. (b) of FIG. 4 is an enlarged view of the through hole of (a) of FIG. 4 and a vicinity of a through hole. (c) of FIG. 4 is an enlarged view of a through hole of another reference example and a vicinity of the through hole.

DESCRIPTION OF EMBODIMENTS

Embodiment 1

An embodiment of the present invention is specifically described below.

(Configuration of Portable Terminal 20)

Figure 1:
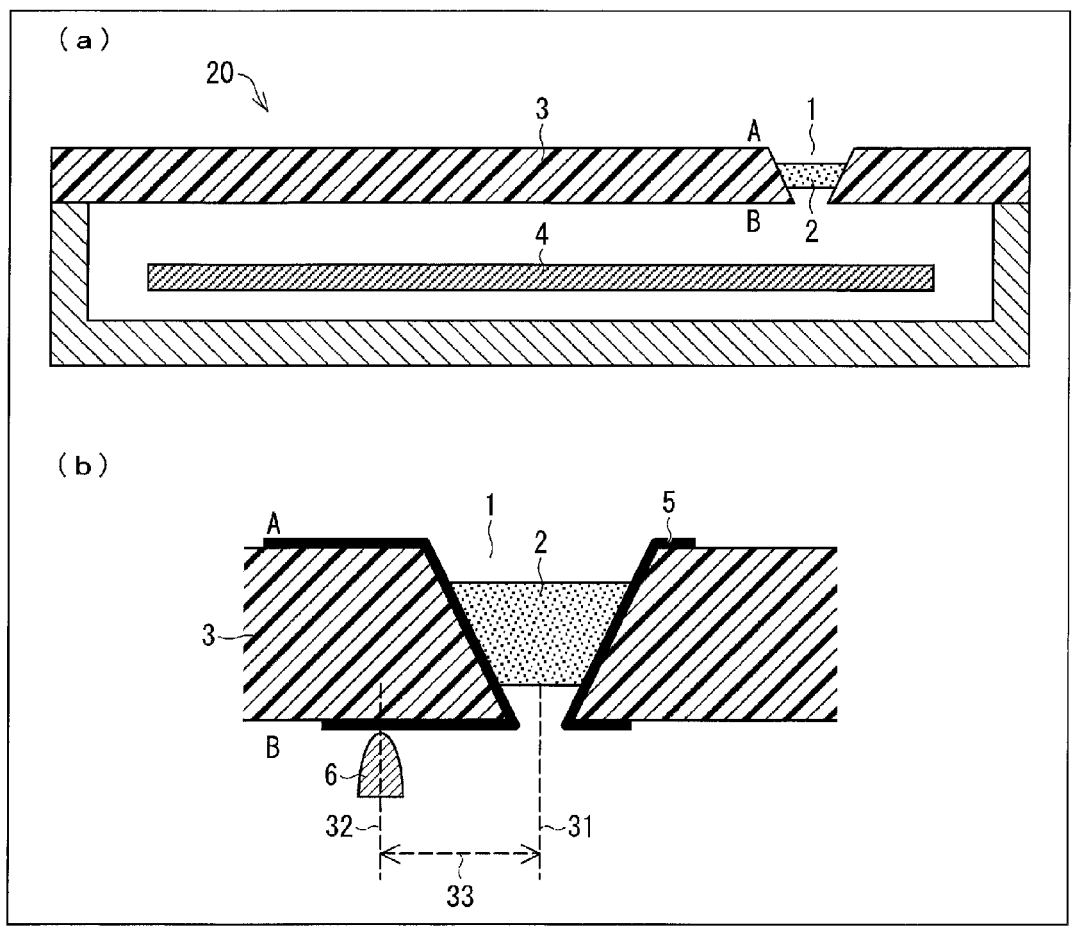

(a) of FIG. 1 illustrates a portable terminal (wireless communication device) 20 in accordance with Embodiment 1 of the present invention. (b) of FIG. 1 is an enlarged view of a through hole 1 of (a) of FIG. 1.

A portable terminal 20, in which a circuit board 4 for wireless communication is stored in a housing 3, functions as a portable terminal by hardware or software installed in the circuit board 4. The housing 3 includes the through hole 1, a grouting material (plug member) 2, and an electrically conductive pattern 5. The electrically conductive pattern 5 is connected via a connector 6 with the circuit board 4. The portable terminal 20 uses the electrically conductive pattern 5 as an antenna to carry out a function of wireless communication.

The housing 3, which is a structure made of a dielectric material, can be made of, for example, a material such as a resin.

Note that an electrically conductive pattern herein refers to a filmy or plate-like electrically conductive material that is formed to have any shape. The electrically conductive pattern 5, which is provided on surfaces of the housing 3, passes through inner walls of the through hole 1, and is stretched from the inside (B side in FIG. 1) surface of the housing 3 to the outside (A side in FIG. 1) surface of the housing 3. In other words, the electrically conductive pattern 5 provided on the inner walls of the through hole 1 electrically conductively connects two surfaces between which the through hole 1 opens (the A side and B side surfaces of the housing 3 in FIG. 1).

In an aspect of the present invention, the electrically conductive pattern 5 can be formed by an LDS (Laser District Structuring) method. That is, the electrically conductive pattern 5 can be formed as below. An organic metal is mixed with a resin of which the housing 3 is made. Then, by carrying out laser irradiation with respect to a region of the housing 3 in which region the electrically conductive pattern 5 is to be formed, metal plating is deposited on the region subjected to laser irradiation, or the region subjected to laser irradiation is made finely rough, so that the metal plating is combined with the region subjected to laser irradiation. The electrically conductive pattern 5 can thus be formed. A substance of which the electrically conductive pattern 5 is made is not particularly limited. The electrically conductive pattern 5 only needs to be made of any electrically conductive material (e.g., a metal such as copper plating or nickel plating). Assume that the electrically conductive pattern 5 is formed on inner walls of the through hole 1 by the LDS method. In this case, the through hole 1 which is tapered and has inclined parts is preferable in carrying out laser irradiation with respect to the inner walls of the through hole 1.

The through hole 1 is a hole which is provided so as to be through the housing 3. The through hole 1 opens into a space between an outside (A side in FIG. 1) and an inside (B side in FIG. 1) of the housing 3 so as to connect electrically conductive patterns 5 placed on the outside (A side in FIG. 1) and the inside (B side in FIG. 1) of the housing 3. As illustrated in FIG. 1, the through hole 1 is provided so that an opening thereof on the outside (A side in FIG. 1) of the housing 3 is larger than an opening thereof on the inside (B side in FIG. 1) of the housing 3. More specifically, the through hole 1 has a taper shape diminishing (being smaller in diameter) from the outside (A side in FIG. 1) to the inside (B side in FIG. 1) of the housing 3. This allows the electrically conductive pattern to be easily formed on the inner walls of the through hole 1 by, for example, the LDS method described earlier. Note that the openings of the through hole 1 are not particularly limited in shape. Examples of a shape of each of the openings include not only a circular shape but also an elliptical shape, polygonal shapes (including a triangle and a quadrangle), and a shape obtained by combining a circular shape or an elliptical shape and a polygonal shape.

In order for a waterproof and dustproof function to be carried out with respect to the inside of the housing 3, the grouting material 2 is provided so as to fill the through hole 1. The grouting material 2 is in a form of a viscous liquid or gel while being injected into the through hole 1, and can harden (dry) after having been injected into the through hole 1. Such the grouting material 2 is exemplified by, but not particularly limited to a liquid glue, a resin gluing agent, an adhesive, and a reinforcing material. Note that the grouting material 2 can be an insulator or can be electrically conductive.

Note also that the through hole 1 which is tapered and has inclined parts is preferable in injecting the grouting material 2 into the through hole 1.

Advantage of Embodiment 1

As described earlier, the through hole 1 is provided so that the opening thereof on the outside (A side in FIG. 1) of the housing 3 is larger than the opening thereof on the inside (B side in FIG. 1) of the housing 3. The configuration allows the through hole 1 to support the grouting material 2 from the inside (B side in FIG. 1) of the housing 3. Therefore, even in a case where the grouting material 2 is pressed from the outside (A side in FIG. 1) of the housing 3, the grouting material 2 does not fall off to enter the inside of the housing 3.

According to this, it is possible to prevent the grouting material 2 from falling off, and prevent the waterproof and dustproof function of the housing 3 from deteriorating. It is also possible to prevent the grouting material 2 from entering the inside of the housing 3 and damaging or breaking a component provided in the housing 3 such as the circuit board 4. In addition, even in a case where an electrically conductive material is used as the grouting material 2, it is possible to prevent the grouting material 2 from entering the inside of the housing 3 and short-circuiting the circuit board 4.

According to the structure illustrated in FIG. 4, it is necessary to consider a strength of adhesion between the grouting materials 2 and the housing 3 so as to prevent the grouting material 2 from falling off. This causes the grouting material 2 to be restricted by design, e.g., by a material of which the grouting material 2 is made. However, according to Embodiment 1, the through hole 1 physically supports the grouting material 2. This allows the grouting material 2 to be less restricted by design, e.g., by a material of which the grouting material 2 is made. Thus, in accordance with purposes of use and specifications, it is possible to use, as the grouting material 2, various substances including a substance that has a desired function such as a low-loss substance and a substance that can reduce cost.

As illustrated in (b) of FIG. 1, the through hole 1 is provided so that the opening thereof on the outside (A side in FIG. 1) of the housing 3 is larger than the opening thereof on the inside (B side in FIG. 1) of the housing 3. Thus, such a configuration allows a shorter distance 33 between a contact point 32 of the electrically conductive pattern 5 with the connector 6 and a through hole center as compared with a case where the opening of the through hole 1 on the inside (B side in the FIG. 1) of the housing 3 is larger than the opening of the through hole 1 on the outside (A side in FIG. 1) of the housing 3. This is because the contact point 32 cannot be located near to the through hole center 31 in a case where the opening of the through hole 1 on the inside (B side in FIG. 1) of the housing 3 is made larger. This allows a shorter length of the electrical conductive 5 required for the inside (B side in FIG. 1) of the housing 3. For example, it is possible to shorten a length of the electrically conductive pattern 5 which is stretched from the contact point 32 to a slope of the through hole 1 which slope faces the contact point 32. According to this, in setting a full length of the electrically conductive pattern 5 (an antenna element) at a length corresponding to a desired frequency band of use, the electrically conductive pattern 5 required for the inside (B side in FIG. 1) of the housing 3 can be made shorter, and the electrically conductive pattern 5 (antenna element) provided on the outside (the A side in FIG. 1) of the housing 3 can be made longer. This allows the antenna element to be at a distance from metal of, for example, the circuit board 4 by providing the antenna element on the outside of the housing 3, so that antenna performance can be improved.

Modified Example

Note that the electrically conductive pattern 5 can not only be used as an antenna element but also be used for various purposes. For example, in an aspect of the present invention, the electrically conductive pattern 5 can be used to electrically conductively connect the inside (B side in FIG. 1) and the outside (A side in FIG. 1) of the housing 3. For example, in a case where a ground such as sheet metal is provided on the outside (A side in FIG. 1) of the housing 3 and the ground is electrically conductively connected with the electrically conductive pattern 5, the ground such as sheet metal and the circuit board 4 can be electrically connected via the electrically conductive pattern 5.

Note that a method by which the electrically conductive pattern 5 is formed is not limited to the LDS method. For example, the electrically conductive pattern 5 can be formed by printing, for example, electrically conductive paste or electrically conductive ink on the housing 3, by using an MID (Molded Interconnect Devices) method, or by attaching an electrically conductive film to the housing 3.

Further, a material with which the hole 1 is filled is not limited to the grouting material 2 which is injected into the through hole 1. The material with which the hole 1 is filled may be any material provided that the material is a plug member serving as a plug with which the through hole 1 is filled. The plug member can be, for example, an elastic body to be inserted into the through hole 1.

Embodiment 2

Another embodiment of the present invention is described below with reference to FIG. 2. Note that, for convenience, members having functions identical to those of the respective members described in Embodiment 1 are given respective identical reference numerals, and a description of those members is omitted here. Note also that the modified example of Embodiment 1 can also be applied to Embodiment 2.

Figure 2:
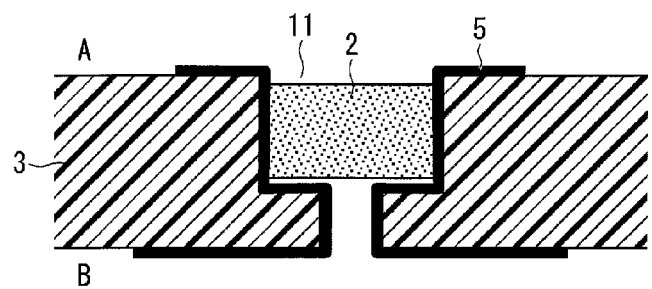
FIG. 2 is an enlarged view of a through hole of Embodiment 2 of the present invention and a vicinity of the through hole.

FIG. 2 is an enlarged view of a vicinity of a through hole 11 of Embodiment 2 of the present invention and a vicinity of the through hole 11. As illustrated in FIG. 2, the through hole 11 has a step which makes the through hole 11 smaller in diameter from an outside (A side in FIG. 2) to an inside (B side in FIG. 2) of a housing 3, and an opening of the through hole 11 on the outside (A side in FIG. 2) of the housing 3 is larger than an opening of the through hole on the inside (B side in FIG. 2) of the housing 3. According to Embodiment 2, as in the case of Embodiment 1, the through hole 11 supports the grouting material 2 from the inside (B side in FIG. 2) of the housing 3. This can prevent the grouting material 2 which is pressed from the outside (A side in FIG. 2) of the housing 3 from falling off to enter the inside (the B side in FIG. 2) of the housing 3. Further, unlike the configuration in which the through hole is tapered, the configuration of the through hole 11 has an advantageous point that the opening of the through hole 11 on the outside (A side in FIG. 2) does not change in size even if the housing 3 increases in thickness.

Embodiment 3

Still another embodiment of the present invention is described below with reference to FIG. 3. Note that, for convenience, members having functions identical to those of the respective members described in Embodiment 1 are given respective identical reference numerals, and a description of those members is omitted here. Note also that the modified example of Embodiment 1 can also be applied to Embodiment 3.

Figure 3:
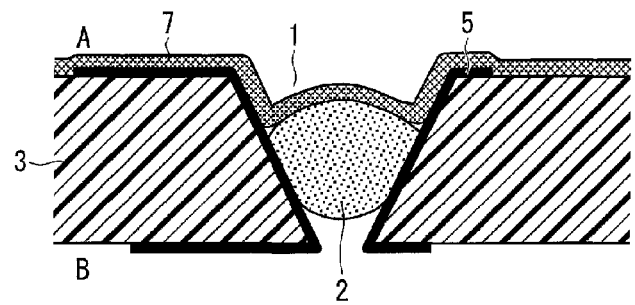
FIG. 3 is an enlarged view of a through hole of Embodiment 3 of the present invention and a vicinity of the through hole.

FIG. 3 is an enlarged view of a through hole 1 of Embodiment 3 of the present invention and a vicinity of the through hole 1. As illustrated in FIG. 3, as in the case of Embodiment 1, the through hole 1 is corn-shaped so as to be larger in diameter toward an outside (A side in FIG. 3) of a housing 3. Since the through hole 1 thus opens toward the outside (A side in FIG. 3) of the housing 3, a grouting material 2 may fall off in a case where a force by which the grouting material 2 is clawed is exerted from the outside (A side in FIG. 3) of the housing 3. In response to this, Embodiment 3 includes a coating film 7 that covers at least part of the outside (A side) surface of the housing 3. The coating film 7 is provided so as to cover the grouting material 2. In a case where the coating film 7 is firmly fixed to the grouting material 2, not only a force by which the grouting material 2 and the housing 3 adhere to each other, but also a force by which the coating film 7 is firmly fixed to the grouting material 2 is applied to the grouting material 2. This makes it possible to more strongly fix the grouting material 2 to the housing 3. Further, since the coating film 7 makes up a difference in level between the grouting material 2 and the housing 3, by making a boundary between the housing 3 and the grouting material 2 smooth so that the grouting material 2 is less likely to be clawed, the grouting material 2 can be more suitably prevented from falling off.

Further, according to Embodiment 3, the coating film 7 can more suitably prevent the grouting material 2 from falling off. This allows the grouting material 2 to be less restricted by design, e.g., by a material of which the grouting material 2 is made, so that various substances are usable as the grouting material 2. Further, since the coating film 7 can protect the grouting material 2 from corrosion, it is possible to successfully use the grouting material 2 that is electrically conductive.

CONCLUSION

A housing in accordance with a first aspect of the present invention is a housing (3) for storing therein a circuit board (4), includes: a through hole (1) opening into a space between an outside and an inside of the housing; an electrically conductive pattern (5) passing through inner walls of the through hole so as to be stretched from the outside surface of the housing to the inside surface of the housing, and being electrically connected to the circuit board; and a plug member (grouting member 2) with which the through hole is filled, the through hole having openings on the outside and the inside, respectively, of the housing, and the opening on the outside of the housing being larger than the opening on the inside of the housing.

According to the configuration, since the opening of the through hole on the outside of the housing is larger than the opening of the through hole on the inside of the housing, the through hole has a shape for supporting the plug member from the inside of the housing. This can prevent the plug member which is pressed from the outside of the housing from falling off, so that the through hole can be suitably filled with the plug member.

In a second aspect of the present invention, the housing in accordance with the first aspect of the present invention can be configured such that: the circuit board stored in the housing is a circuit board for wireless communication; and the electrically conductive pattern is an antenna element.

According to the configuration, in a case where the electrically conductive pattern provided on the outside surface of the housing is used as an antenna element, it is possible to efficiently carry out wireless communication. In particular, the configuration, in which the opening of the through hole on the outside of the housing is larger than the opening of the through hole on the inside of the housing, allows a contact point of the electrically conductive pattern with the circuit board to be located nearer to the through hole, as compared with a case where the opening of the through hole on the inside the housing is larger than the opening of the through hole on the outside of the housing. This allows the antenna element to be at a distance from metal of, for example, the circuit board by providing the antenna element on the outside of the housing 3, so that antenna performance can be improved.

In a third aspect of the present invention, the housing in accordance with the first or second aspect of the present invention can be configured such that the through hole has a taper shape diminishing from the outside to the inside of the housing.

The configuration makes it possible to more suitably inject the plug member into the through hole. The configuration also makes it possible to more easily form the electrically conductive pattern on the inner walls of the through hole by use of, for example, an LDS (Laser Direct Structuring) method.

In a fourth aspect of the present invention, the housing in accordance with any one of the first through third aspects of the present invention can be configured to further include: a coating film for covering at least part of the outside surface of the housing, the coating film covering the plug member.

According to the configuration, in a case where the coating film is firmly fixed to the plug member, the plug member can be more strongly fixed to the housing. Further, by causing the coating material to make a boundary between the housing and the plug member smooth so that the plug member is less likely to be clawed, the plug member can be more suitably prevented from falling off.

A wireless communication device (portable terminal 20) in accordance with a fifth aspect of the present invention includes: the housing in accordance with any one of the first through fourth aspects; and the circuit board.

The configuration yields an effect identical to those yielded by the first through four aspects of the present invention.

The present invention is not limited to the description of the embodiments above, but may be altered by a skilled person within the scope of the claims. An embodiment based on a proper combination of technical means disclosed in different embodiments is encompassed in the technical scope of the present invention. Further, a new technical feature can be formed by combining technical measures disclosed in the embodiments.

INDUSTRIAL APPLICABILITY

The present invention can be widely used in electronic devices each including a housing for storing therein a circuit board. In particular, the present invention is suitably usable in wireless communicating devices such as a smartphone and a tablet terminal.

REFERENCE SIGNS LIST 1, 11 Through hole
2 Grouting material (plug member)
3 Housing
4 Circuit board
5 Electrically conductive pattern
6 Connector
7 Coating film
20 Portable terminal (wireless communication device)

The invention claimed is:

1. A housing for storing therein a circuit board, comprising:
   a through hole opening into a space between an outside and an inside of the housing;
   an electrically conductive pattern passing through an inner wall of the through hole so as to be stretched from an outside surface of the housing to an inside surface of the housing, and being electrically connected to the circuit board; and
   a plug member with which the through hole is filled,
   the through hole having (a) openings on the outside and the inside, respectively, of the housing and (b) a uniform taper shape diminishing from the outside to the inside of the housing, and the opening on the outside of the housing being larger than the opening on the inside of the housing, and
   the plug member being a grouting material that is injected into the through hole,
   the electrically conductive pattern being connected with the circuit board at a contact point on the inside surface and being stretched from the contact point to a side of the inner wall which side is opposite to the contact point across the through hole.

2. The housing as set forth in claim 1, wherein the plug member is an insulator.

3. The housing as set forth in claim 1, wherein the plug member is electrically conductive.

4. The housing as set forth in claim 1, wherein:
   the circuit board stored in the housing is a circuit board for wireless communication; and
   the electrically conductive pattern is an antenna element.

5. The housing as set forth in claim 1, further comprising:
   a coating film for covering at least part of the outside surface of the housing,
   the coating film covering the plug member.

6. A wireless communication device comprising:
   the housing recited in claim 1; and
   the circuit board.

7. The housing as set forth in claim 1, wherein the plug member is in a form of a viscous liquid or gel while being injected into the through hole, and hardens after being injected into the through hole.

8. The housing as set forth in claim 1, wherein the electrically conductive pattern is connected with the circuit board at a contact point and is stretched from the contact point to a slope of the through hole which slope faces the contact point.

9. The housing as set forth in claim 1, wherein the electrically conductive pattern is stretched from the inside surface of the housing to the outside surface of the housing.

\* \* \* \* \*